United States Patent [19]
Floyd et al.

[11] Patent Number: 5,414,380
[45] Date of Patent: May 9, 1995

[54] INTEGRATED CIRCUIT WITH AN ACTIVE-LEVEL CONFIGURABLE AND METHOD THEREFOR

[75] Inventors: Jeffery A. Floyd, Round Rock; Lloyd P. Matthews, Buda, both of Tex.

[73] Assignee: Motorola, Inc., Schaumburg, Ill.

[21] Appl. No.: 47,895

[22] Filed: Apr. 19, 1993

[51] Int. Cl.⁶ .......................................... H03K 19/003
[52] U.S. Cl. ...................................... 327/198; 327/43; 327/407; 326/46
[58] Field of Search ............... 307/465, 468, 241, 243, 307/291, 272.1, 272.2, 272.3; 328/104

[56] References Cited

U.S. PATENT DOCUMENTS

| | | | |
|---|---|---|---|
| 4,029,900 | 6/1977 | Addeo | 328/155 |
| 4,138,613 | 2/1979 | Tanaka | 307/272.3 |
| 4,783,606 | 11/1988 | Goetting | 307/465 |
| 4,900,949 | 2/1990 | Saitoh | 307/272.2 |
| 4,933,575 | 6/1990 | Aso | 307/468 |
| 4,940,909 | 7/1990 | Mulder et al. | 307/468 |
| 4,987,319 | 1/1991 | Kawana | 307/465 |
| 5,025,174 | 6/1991 | Shikata | 307/291 |
| 5,029,272 | 7/1991 | Fourcroy et al. | 307/518 |
| 5,072,137 | 12/1991 | Slemmer | 307/465 |
| 5,148,052 | 9/1992 | Yellamilli | 307/571 |
| 5,166,545 | 11/1992 | Harrington | 307/296.1 |

*Primary Examiner*—Timothy P. Callahan
*Assistant Examiner*—Terry L. Englund
*Attorney, Agent, or Firm*—Paul J. Polansky

[57] ABSTRACT

An integrated circuit (20) configures the active level of an input, output, or input/output pin by sensing a logic state on the pin's bonding pad (21) at the inactivation of a reset signal, such as a power-on reset signal. The integrated circuit (20) selects a true or complement signal to provide to or from an internal circuit (25). The voltage level on the pin is latched on the active-to-inactive transition of the power-on reset signal. Thus, the use of proper board-level termination resistors (70, 71) programs the pins to the desired active logic level without the need for additional logic circuitry or a dedicated device pin.

20 Claims, 3 Drawing Sheets

INTEGRATED CIRCUIT WITH AN ACTIVE-LEVEL CONFIGURABLE AND METHOD THEREFOR

FIELD OF THE INVENTION

This invention relates generally to electrical circuits, and more particularly, to input and output circuitry for integrated circuits.

BACKGROUND OF THE INVENTION

Integrated circuits such as microprocessors use binary control signals to control the operation of other devices in the system such as peripheral integrated circuits. These control signals may either be "active low", signifying that when the signal has a relatively low voltage known as a logic low voltage, the signal is active or logically true, or "active high", signifying that when the signal has a relatively high voltage known as a logic high voltage, the signal is active or logically true. Different microprocessor families which control the operation of peripheral devices use different active levels for their control signals. For example, a Motorola MC68000-family microprocessor has a control signal known as the "$R/\overline{W}$" signal indicating whether a read cycle or a write cycle is in progress. A logic high voltage indicates that a read cycle is in progress, whereas a logic low voltage indicates that a write cycle is in progress. However, the analogous signal in an Intel 8086-family microprocessor, the read strobe "$\overline{R}$", is active at a logic low. Known peripherals may be operated with only one of the two microprocessor families without requiring either extra external logic or an extra device configuration pin. What is needed, then, is an integrated circuit which interfaces to both active-high and active-low control signals without additional components.

SUMMARY OF THE INVENTION

Accordingly, there is provided, in one form, an integrated circuit with an active-level configurable pin, comprising a bonding pad, a latching portion, an input pin configuration portion, and an internal circuit. The bonding; pad receives an input signal. The latching portion is coupled to the bonding pad, latches a logic state of the input signal in response to an inactivation of a reset signal, and provides a first signal indicative of the latched logic state. The input pin configuration portion is coupled to the latching portion, and provides an internal input signal as a selected one of the input signal or a complement of the input signal selected in response to the first signal. The internal circuit receives the selected one of the input signal and the complement of the input signal.

In another form, there is provided a method for configuring an integrated circuit pin for an unknown active voltage level of an external signal. A logic state of the external signal on the integrated circuit pin is sensed at an inactivation of a reset signal. The logic state is latched to provided a latched signal. An internal signal is provided at a true logic state of the external signal in response to the latched signal being in a first logic state. The internal signal is provided at a complementary logic state of the external signal in response to the latched signal being in a second logic state. The internal input signal is provided to an internal circuit.

These and other features and advantages will be more clearly understood from the following detailed description taken in conjunction with the accompanying drawings.

BRIEF DESCRIPTION OF THE DRAWINGS

FIG. I illustrates in partial schematic and partial block diagram form an integrated circuit with an active-level configurable pin in accordance with the present invention.

DETAILED DESCRIPTION OF A PREFERRED EMBODIMENT

Figure 1:
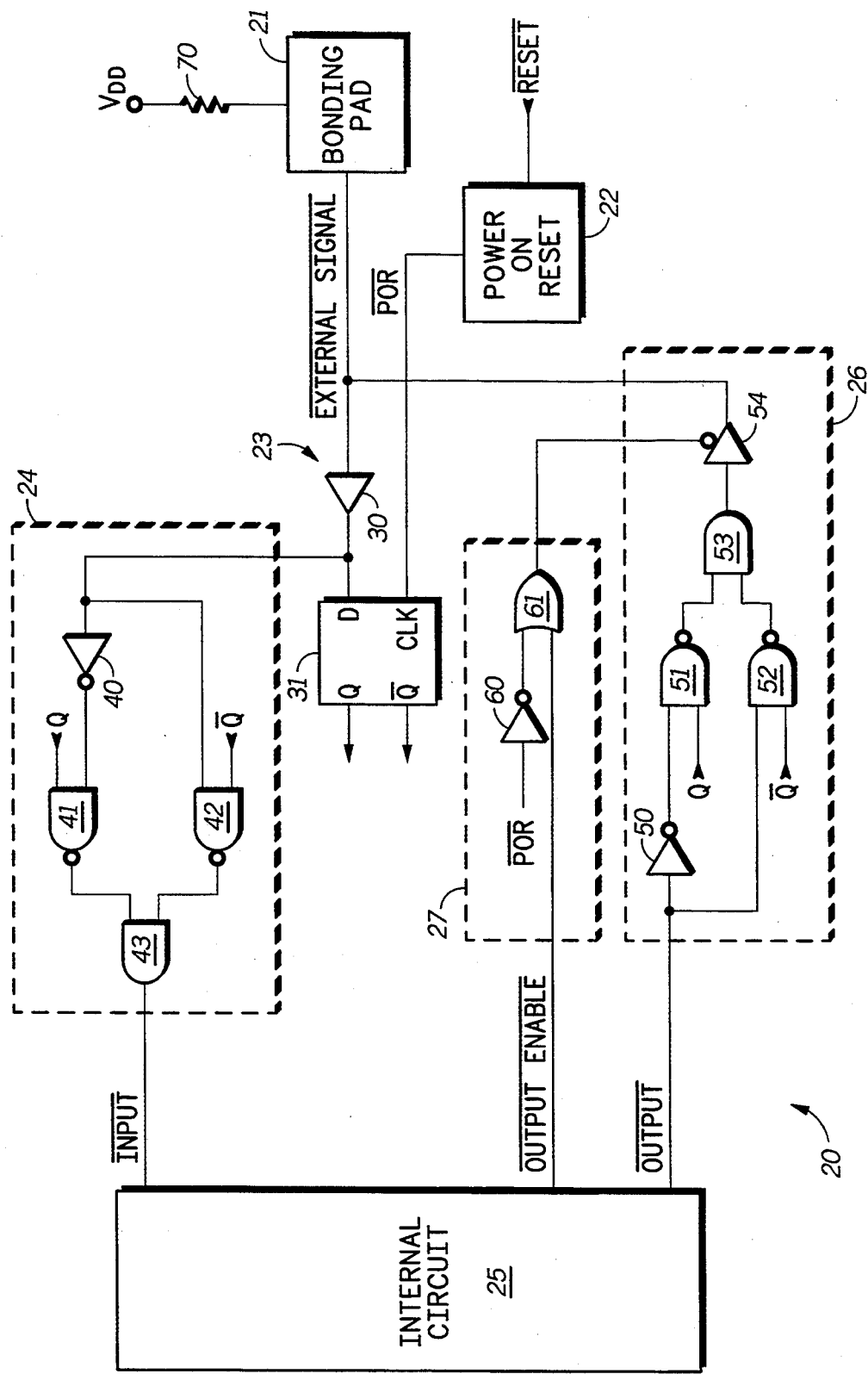

FIG. 1 illustrates in partial schematic and partial block diagram form an integrated circuit 20 with an active-level configurable pin in accordance with the present invention. Integrated circuit 20 includes generally a bonding pad 21, a power on reset circuit 22, a latching circuit 23, an input pin configuration circuit 24, an internal circuit 25, an output pin configuration circuit 26, and an input/output control circuit 27. Bonding pad 21 is connected through a bond wire to an integrated circuit package pin or lead (not shown), which typically connects to a circuit board. In the illustrated embodiment, bonding pad 21 conducts an active-low signal labelled "$\overline{\text{EXTERNAL SIGNAL}}$". In accordance with preferred circuit board design, an external pullup resistor 70 connects the $\overline{\text{EXTERNAL SIGNAL}}$ line to a power supply voltage terminal labelled "$V_{DD}$". $V_{DD}$ is a positive power supply voltage representative of a logic high voltage. Thus, when no device on the circuit board is driving the $\overline{\text{EXTERNAL SIGNAL}}$ line, resistor 70 pulls the voltage up to approximately $V_{DD}$ so that no integrated circuit connected to the $\overline{\text{EXTERNAL SIGNAL}}$ line recognizes an active signal level as an input. As will be explained in greater detail below, bonding pad 21 may be connected to a signal line which conducts an active-high signal as well.

Power on reset circuit 22 receives an active-low reset signal labelled $\overline{\text{RESET}}$ and provides an active low power on reset signal labelled $\overline{\text{POR}}$ in response. Power on reset circuit 22.is a conventional power on reset circuit which activates signal $\overline{\text{POR}}$ for a predetermined length of time after power is applied and after sensing signal $\overline{\text{RESET}}$ being in an active state.

Latching circuit 23 is connected to bonding pad 21 and to power on reset circuit 22, and provides true and complement output signals indicative of a logic state of bonding pad 21 at an inactivation of signal $\overline{\text{POR}}$. Latching circuit 23 includes a buffer 30 and a D flip-flop 31. Buffer 30 has an input terminal connected to bonding pad 21 for receiving $\overline{\text{EXTERNAL SIGNAL}}$, and an output terminal, and is a conventional non-inverting buffer with high input impedance and low output impedance. D flip-flop 31 has a data or D input terminal connected the output terminal of buffer 30, a clock or CLK input terminal for receiving signal POR, a true or Q output terminal for providing a signal labelled "Q", and a complementary or $\overline{Q}$ output terminal for providing signal labelled "$\overline{Q}$".

Input pin configuration circuit 24 is connected to latching circuit 23 and provides a signal labelled "$\overline{\text{IN}}$ PUT" to internal circuit 25. In the illustrated embodiment, internal circuit 25 recognizes signal $\overline{\text{INPUT}}$ as an active-low input signal, and input pin configuration circuit 24 ensures that $\overline{\text{INPUT}}$ is active at a logic low voltage, regardless of the active level of $\overline{\text{EXTERNAL SIGNAL}}$. To accomplish this result, input pin configuration circuit 24 configures $\overline{\text{INPUT}}$ to be either a true or complement version of $\overline{\text{EXTERNAL SIGNAL}}$ in response to signals Q and $\overline{Q}$. For example, in the illustrated embodiment, during power on reset, resistor 70 pulls bonding pad 21 up to $V_{DD}$, representative of a logic high voltage. A logic high voltage at the end of power on reset indicates that the circuit board has been designed to accommodate an active-low signal. Thus, input pin configuration circuit 24 provides signal $\overline{\text{INPUT}}$ in the same logic state as $\overline{\text{EXTERNAL SIGNAL}}$ during normal operation. Conversely, if input pin configuration circuit 24 were to sense a logic low voltage on bonding pad 21 at the end of power on reset, then input pin configuration circuit 24 would invert the external signal to provide signal $\overline{\text{INPUT}}$.

Input pin configuration circuit 24 includes an inverter 40, NAND gates 41 and 42, and an AND gate 43. Inverter 40 has an input terminal connected to the output terminal of buffer 30, and an output terminal. NAND gate 41 has a first input terminal for receiving signal Q, a second input terminal connected to the output terminal of inverter 40, and an output terminal. NAND gate 42 has a first input terminal connected to the output terminal of buffer 30, a second input terminal for receiving signal $\overline{Q}$, and an output terminal. AND gate 43 has a first input terminal connected to the output terminal of NAND gate 41, a second input terminal connected to the output terminal of NAND gate 42, and an output terminal for providing signal $\overline{\text{INPUT}}$ to internal circuit 25.

Internal circuit 25 performs any function conventionally performed by integrated circuits which have binary input, output, or input/output control signals, such as a data processor, memory, peripheral, and the like. Internal circuit 25 receives active-low signal $\overline{\text{INPUT}}$ and performs a predetermined function in response. Internal circuit 25 also provides an output signal labelled "$\overline{\text{OUTPUT}}$" and a control signal labelled "$\overline{\text{OUTPUT ENABLE}}$". Internal circuit 25 includes other input, output, and input/output bonding pads not shown in FIG. 1.

Output pin configuration circuit 26 is connected to bonding pad 21 and receives a signal labelled "$\overline{\text{OUTPUT}}$" from internal circuit 25. In the illustrated embodiment, internal circuit 25 provides signal $\overline{\text{OUTPUT}}$ as an active-low output signal, and output pin configuration circuit 26 ensures that $\overline{\text{OUTPUT}}$ is provided externally at the proper active level, in the illustrated embodiment as an active-low signal.

Output pin configuration circuit 26 includes an inverter 50, NAND gates 51 and 52, an AND gate 53, and a three-state buffer 54. Inverter 50 has an input terminal for receiving signal $\overline{\text{OUTPUT}}$, and an output terminal. NAND gate 51 has a first input terminal connected to the output terminal of inverter 50, a second input terminal for receiving signal Q, and an output terminal. NAND gate 52 has a first input terminal for receiving signal $\overline{\text{OUTPUT}}$, a second input terminal for receiving signal $\overline{Q}$, and an output terminal. AND gate 53 has a first input terminal connected to the output terminal of NAND gate 51, a second input terminal connected to the output terminal of NAND gate 52, and an output terminal. Three-state buffer 54 has an input terminal connected to the output terminal of AND gate 53, a control input terminal, and an output terminal connected to bonding pad 21.

Input/output control circuit 27 ensures that when $\overline{\text{EXTERNAL SIGNAL}}$ is not to be driven by intergrated circuit 20 such as when integrated circuit 20 expects to receive $\overline{\text{EXTERNAL SIGNAL}}$ as an input signal, output pin configuration circuit 26 does not drive bonding pad 21. Input/output control circuit 27 includes an inverter 60 and an OR gate 61. Inverter 60 has an input terminal for receiving signal $\overline{\text{POR}}$, and an output terminal. OR gate 61 has a first input terminal connected to the output terminal of inverter 60, a second input terminal for receiving signal $\overline{\text{OUTPUT ENABLE}}$, and an output terminal connected to the control input terminal of three-state buffer 54.

For proper operation, it is necessary that signal $\overline{\text{POR}}$ become inactive before any device connected to the signal line to which bonding pad 21 is connected can drive $\overline{\text{EXTERNAL SIGNAL}}$. Latching portion 23 latches the state of the signal on bonding pad 21 at the active-to-inactive transition of signal $\overline{\text{POR}}$. If as illustrated the external signal is an active-low signal, then preferred circuit board design calls for the inclusion of a pullup resistor 70, which prevents any device connected to the signal line from erroneously sensing the signal in an active state when no device is driving it. Resistor 70 has a first terminal connected to $V_{DD}$, and a second terminal electrically connected to bonding pad 21, through a bond wire, a package, and a circuit board trace not shown in FIG. 1. Thus, signal Q is active at a logic high and signal $\overline{Q}$ is active at a logic low.

When integrated circuit 20 receives $\overline{\text{EXTERNAL SIGNAL}}$ as an input signal, signal $\overline{\text{OUTPUT ENABLE}}$ is inactive at a logic high, and thus the output of OR gate 61 is inactive at a logic high, causing three-state buffer 54 to be in a high-impedance state. The output of NAND gate 41 is determined by the other input, which is the complement of $\overline{\text{EXTERNAL SIGNAL}}$. Since signal $\overline{Q}$ is active at a logic low, the output of NAND gate 42 is a logic high, and the output of AND gate 43 depends on the other input thereof. Thus, signal $\overline{\text{INPUT}}$ is provided with the same active level as $\overline{\text{EXTERNAL SIGNAL}}$, namely active at a logic low.

When integrated circuit 20 provides $\overline{\text{EXTERNAL SIGNAL}}$ as an output signal, signal $\overline{\text{OUTPUT ENABLE}}$ is active at a logic low, and thus the output of OR gate 61 is active at a logic low, causing three-state buffer 54 to provide $\overline{\text{EXTERNAL SIGNAL}}$ in response to the input thereof. The output of NAND gate 51 is determined by the other input, which is the complement of signal $\overline{\text{OUTPUT}}$. Since signal $\overline{Q}$ is active at a logic low, the output of NAND gate 52 is a logic high, and the output of AND gate 53 depends on the other input thereof. Thus, $\overline{\text{EXTERNAL SIGNAL}}$ is provided with the same active level as $\overline{\text{OUTPUT}}$, namely active at a logic low.

In other embodiments, integrated circuit 20 may configure bonding pad 21 to be either an input-only pin, or an output-only pin. If integrated circuit 20 configures bonding pad 21 to be an input-only pin, then output pin configuration circuit 26 and input/output control circuit 27 are not needed. Similarly, if integrated circuit 20 configures bonding pad 21 to be an output-only pin, then input pin configuration circuit 24 is not needed. In either case, however, latching circuit 23 is required.

Figure 2:
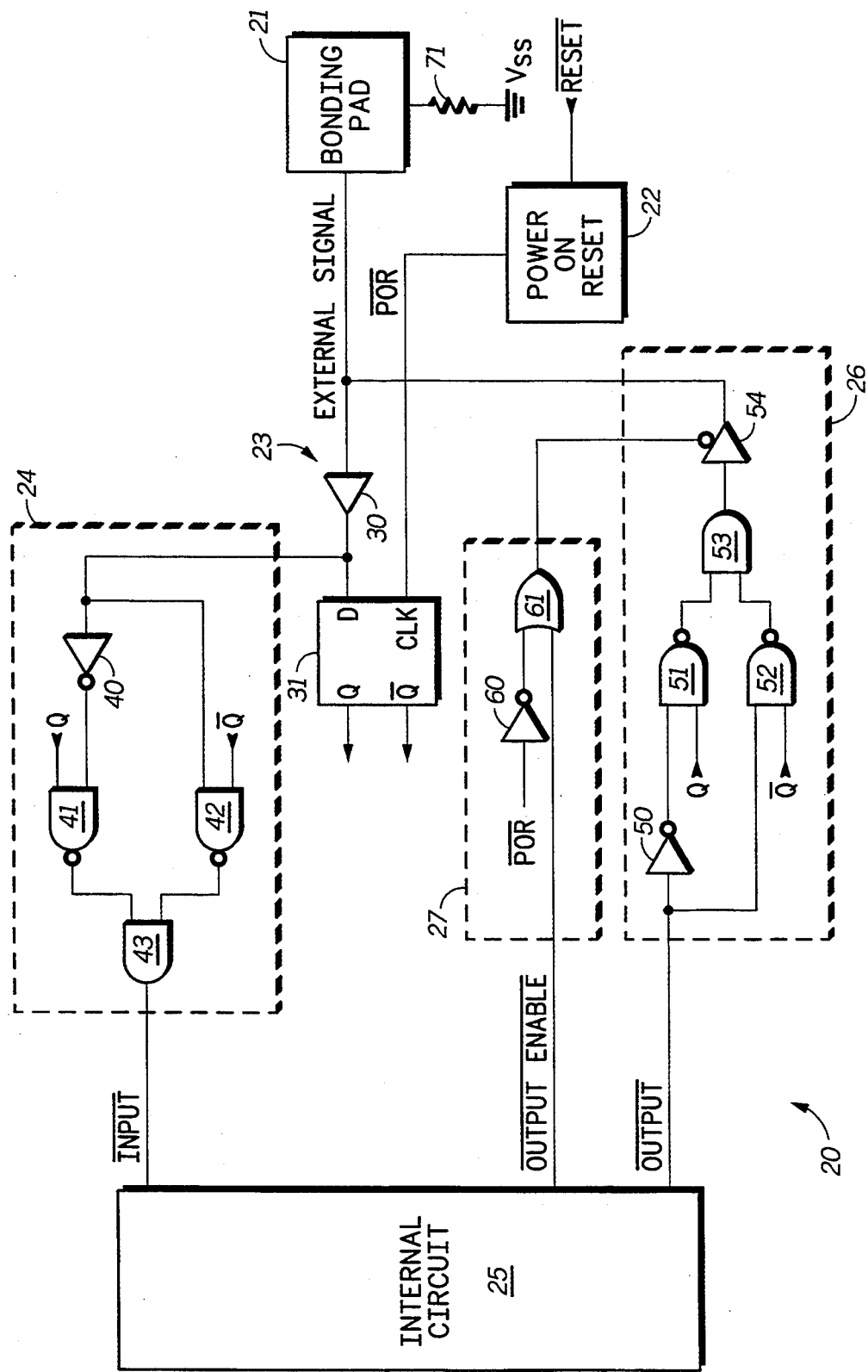
FIG. 2 illustrates in partial schematic and partial block diagram form the integrated circuit of FIG. 1 in a system with an active-high external signal.

FIG. 2 illustrates in partial schematic and partial block diagram form integrated circuit 20 of FIG. 1 in a system with an active-high external signal, labelled "EXTERNAL/ e,ovs/SIGNAL". All elements of integrated circuit 20 are common with corresponding elements shown in FIG. 1 and retain their previous reference numbers. In this case, preferred circuit board design calls for the inclusion of a pulldown resistor 71, which prevents any device connected to the EXTERNAL SIGNAL line from erroneously sensing the signal in an active state when no device is driving it. Resistor 71 has a first terminal electrically connected to bonding pad 21, through a bond wire, a package, and a circuit board trace not shown in FIG. 2, and second terminal connected to a power supply voltage terminal labelled "$V_{SS}$". $V_{SS}$ is a more-negative power supply voltage terminal representative of a logic low voltage.

In this embodiment, latching circuit 23 senses a logic low voltage on bonding pad 21 at the active-to-inactive transition of signal $\overline{POR}$, and latches this state. Thus, signal Q is a logic low, and signal $\overline{Q}$ is a logic high. When integrated circuit 20 receives EXTERNAL SIGNAL as an input signal, signal $\overline{OUTPUT\ ENABLE}$ is inactive at a logic high, and thus the output of OR gate 61 is inactive at a logic high, causing three-state buffer 54 to be in a high-impedance state. The output of NAND gate 42 is determined by the other input, which is equivalent to EXTERNAL SIGNAL. Since signal Q is inactive at a logic low, the output of NAND gate 41 is a logic high, and the output of AND gate 43 depends on the other input thereof. Thus, signal $\overline{INPUT}$ is provided with the complement of the active level of EXTERNAL SIGNAL, namely active at a logic low.

When integrated circuit 20 provides EXTERNAL SIGNAL as an output signal, signal $\overline{OUTPUT\ ENABLE}$ is active at a logic low, and thus the output of OR gate 61 is active at a logic low, causing three-state buffer 54 to provide EXTERNAL SIGNAL in response to the input thereof. The output of NAND gate 52 is determined by the other input, which is equivalent to signal $\overline{OUTPUT}$. Since signal Q is inactive at a logic low, the output of NAND gate 51 is a logic high, and the output of AND gate 53 depends on the other input thereof. Thus, EXTERNAL SIGNAL is provided with the complement of the active level of signal $\overline{OUTPUT}$, namely active at a logic high.

In other embodiments, it is possible to provide signal $\overline{RESET}$ directly to the CLK input of flip flop 31; in that case, however, flip-flop 31 must latch the value of bonding pad 21 before any device in the system is able to drive the control signal. Integrated circuit 20 is constructed using complementary metal oxide semiconductor (CMOS) transistor technology, and buffer 30 recognizes transistor-transistor logic (TTL) input signal levels, namely 2.0 volts or greater for a logic high, and 0.8 volts or less for a logic low. Buffer 54 provides TTL output signal levels, namely 2.4 volts or greater for a logic high, and 0.5 volts or less for a logic low. $V_{DD}$ has a typical value of approximately 5.0 volts, while $V_{SS}$ has a typical value of 0.0 volts. However, it should be apparent that the present invention is applicable to other transistor technologies and other active levels as well. Note that integrated circuit 20 also conventionally includes special structures to protect internal circuitry from electrostatic discharge (ESD), but these structures are not shown in FIG. 1.

Figure 3:
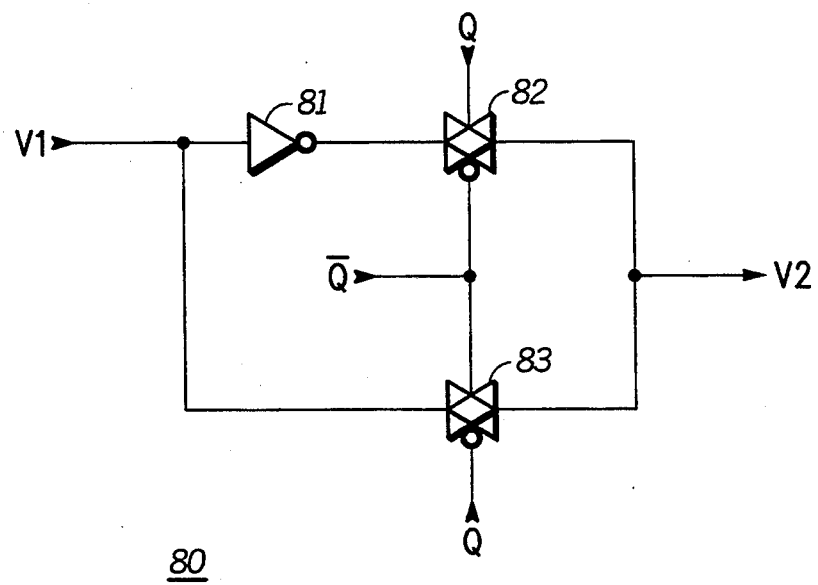
FIG. 3 illustrates in schematic form a portion of the input or output pin configuration circuits of FIGS. 1 or 2 in accordance with a preferred embodiment of the present invention.

FIG. 3 illustrates in schematic form a portion 80 of input pin configuration circuit 24 or output pin configuration circuit 26 of FIGS. 1 or 2 in accordance with a preferred embodiment of the present invention. In portion 80, an inverter 81 has an input terminal for receiving a logic signal labelled "V1", and an output terminal. A transmission gate 82 has a first terminal connected to the output terminal of inverter 81, a second terminal for providing a logic signal labelled "V2", a true control terminal for receiving signal Q, and a complementary control terminal for receiving signal $\overline{Q}$. A transmission gate 83 has a first terminal for receiving signal V1, a second terminal connected to the second terminal of transmission gate 82, a true control terminal for receiving signal $\overline{Q}$, and a complementary control terminal for receiving signal Q. If portion 80 replaces corresponding elements of input pin configuration circuit 24 logic signal V1 corresponds to the output of buffer 30, and logic signal V2 corresponds to signal $\overline{INPUT}$. If portion 80 replaces corresponding elements of Output pin configuration circuit 26, logic signal V1 corresponds to signal $\overline{OUTPUT}$, and logic signal V2 corresponds to the output of AND gate 53. Portion 80 reduces transistor count below that of configuration circuits 24 and 26. For example, if CMOS transistors are used, then transmission gates 82 and 83 require only two transistors each, whereas each two-input full-CMOS logic gate requires four transistors.

While the invention has been described in the context of a preferred embodiment, it will be apparent to whose skilled in the art that the present invention may be modified in numerous ways and may assume many embodiments other than that specifically set out and described above. For example, the logic states of signals internal to integrated circuit 20 may vary. Accordingly, it is intended by the appended claims to cover all modifications of the invention which fall within the true spirit and scope of the invention.

We claim:

1. An integrated circuit with an active-level configurable pin, comprising:
    a bonding pad for receiving an input signal;
    latching means coupled to said bonding pad, for latching a logic state of said input signal in response to an inactivation of a reset signal, and for providing a first signal indicative of said latched logic state;
    input pin configuration means coupled to said latching means, for providing an internal input signal as a selected one of said input signal or a complement of said input signal selected in response to said first signal; and
    an internal circuit for receiving said selected one of said input signal or said complement of said input signal.

2. The integrated circuit of claim 1 further comprising a power-on reset circuit having an input for receiving an external reset signal, and an output for providing said reset signal.

3. The integrated circuit of claim 1 wherein said latching means comprises a flip-flop having a data input coupled to said bonding pad, a clock input for receiving said reset signal, a true output coupled to said input pin configuration means, and a complementary output coupled to said input pin configuration means.

4. The integrated circuit of claim 3 wherein said latching means further comprises a buffer having an input terminal coupled to said bonding pad, an output terminal coupled to said data input of said flip-flop.

5. The integrated circuit of claim 3 wherein said input pin configuration means comprises:
an inverter having an input terminal coupled to said bonding pad, and an output terminal;
a first transmission gate having a first terminal coupled to said output terminal of said inverter, a second terminal for providing said internal input signal, a true control terminal coupled to said true output of said flip-flop, and a complementary control terminal coupled to said complementary output of said flip-flop; and
a second transmission gate having a first terminal coupled to said bonding pad, a second terminal coupled to said second terminal of said first transmission gate, a true control terminal coupled to said complementary output of said flip-flop, and a complementary control terminal coupled to said true output of said flip-flop.

6. The integrated circuit of claim 3 further comprising:
output pin configuration means coupled to said bonding pad, said latching means, and said internal circuit, for providing a selected one of an internal output signal received from said internal circuit or a complement of said internal output signal, selected in response to said first signal, to said bonding pad when enabled; and
input/output control means coupled to said internal circuit and to said output pin configuration means, for disabling said output pin configuration means in response to an output enable signal being inactive.

7. The integrated circuit of claim 6 wherein said input/output control means further disables said output pin configuration means in response to said reset signal being active.

8. The integrated circuit of claim 7 wherein said input/output control means comprises:
an inverter having an input terminal for receiving said reset signal, and an output terminal; and
an OR gate having a first input terminal coupled to said output terminal of said inverter, a second input terminal for receiving said output enable signal, and an output terminal coupled to said output pin configuration means for providing a control signal thereto.

9. The integrated circuit of claim 6 wherein said output pin configuration means comprises:
an inverter having an input terminal for receiving said internal output signal, and an output terminal;
a first transmission gate having a first terminal coupled to said output terminal of said inverter, a second terminal, a true control terminal coupled to said true output of said flip-flop, and a complementary control terminal coupled to said complementary output of said flip-flop;
a second transmission gate having a first terminal for receiving said internal output signal, a second terminal coupled to said second terminal of said first transmission gate, a true control terminal coupled to said complementary output of said flip-flop, and a complementary control terminal coupled to said true output of said flip-flop; and
a buffer having an input terminal coupled to said second terminals of said first and second transmission gates, a control input terminal coupled to said input/output control means, and an output terminal coupled to said bonding pad.

10. An integrated circuit with an active-level configurable pin, comprising:
an internal circuit for providing an internal output signal;
bonding pad for providing an output signal;
latching means coupled to said bonding pad, for latching a logic state of said bonding pad in response to an inactivation of a reset signal, and for providing a first signal indicative of said latched logic state; and
output pin configuration means coupled to said bonding pad, to said internal circuit, and to said latching means, for providing an output signal to said bonding pad as a selected one of said internal output signal or a complement of said internal output signal selected in response to said first signal.

11. The integrated circuit of claim 10 further comprising a power-on reset circuit having an input for receiving an external reset signal, and an output for providing said reset signal.

12. The integrated circuit of claim 10 wherein said latching means comprises a flip-flop having a data input coupled to said bonding pad, a clock input for receiving said reset signal, a true output coupled to said output pin configuration means, and a complementary output coupled to said output pin configuration means.

13. The integrated circuit of claim 12 wherein said latching means further comprises a buffer having an input terminal coupled to said bonding pad, and an output terminal coupled to said flip-flop.

14. The integrated circuit of claim 12 further comprising an input/output control means coupled to said internal circuit, for disabling said output pin configuration means in response to an output enable signal being inactive, and wherein said output pin configuration means comprises:
an inverter having an input terminal for receiving said internal output signal, and an output terminal;
a first transmission gate having a first terminal coupled to said output terminal of said inverter, a second terminal, a true control terminal coupled to said true output of said flip-flop, and a complementary control terminal coupled to said complementary output of said flip-flop;
a second transmission gate having a first terminal for receiving said internal output signal, a second terminal coupled to said second terminal of said first transmission gate, a true control terminal coupled to said complementary output of said flip-flop, and a complementary control terminal coupled to said true output of said flip-flop; and
a buffer having an input terminal coupled to said second terminals of said first and second transmission gates, a control input terminal coupled to said input/output control means, and an output terminal coupled to said bonding pad.

15. A method for configuring an integrated circuit pin for an unknown active voltage level of an external signal, comprising the steps of:
sensing a logic state of the external signal on the integrated circuit pin at an inactivation of a reset signal;
latching said logic state to provide a latched signal;
providing an internal signal at a true logic state of the external signal in response to said latched signal being in a first logic state;

providing said internal signal at a complementary logic state of the external signal in response to said latched signal being in a second logic state; and providing said internal input signal to an internal circuit.

16. The method of claim 15 further comprising the steps of:

providing an external reset signal to an input of a power on reset circuit; and providing an output of said power on reset circuit as said reset signal.

17. The method of claim 15 wherein said step of providing said internal signal at said true logic state of the external signal further comprises the step of providing an internal signal at a true logic state of the external signal in response to an output enable signal being inactive and to said latched signal being in a first logic state, and wherein said step of providing said internal signal at said complementary logic state of the external signal further comprises the step of providing said internal signal at said complementary logic state of the external signal in responses to said output enable signal being inactive and to said latched signal being in a second logic state.

18. The method of claim 17 further comprising the steps of:

receiving an internal output signal from said internal circuit;

providing the external signal at a true logic state of said internal output signal in response to said output enable signal being active and to said latched signal being in a first logic state; and providing the external signal at a complementary logic state of the internal signal in response to said output enable signal being active and to said latched signal being in a second logic state.

19. A method for configuring an integrated circuit pin for an unknown active voltage level of an external signal, comprising the steps of:

sensing a logic state of the external signal on the integrated circuit pin at an inactivation of a reset signal;

latching said logic state to provide a latched signal;

receiving an internal output signal from an internal circuit;

providing the external signal at a true logic state of said internal output signal in response to said latched signal being in a first logic state;

providing the external signal at a complementary logic state of said internal output signal in response to said latched signal being in a second logic state; and providing the external signal to the integrated circuit pin.

20. The method of claim 19 further comprising the steps of:

providing an external reset signal to an input of a power on reset circuit; and providing an output of said power on reset circuit as said reset signal.

* * * * *